United States Patent [19]

Coughlin

[11] 3,755,017

[45] Aug. 28, 1973

[54] METHOD OF DIFFUSING AN IMPURITY INTO A SEMICONDUCTOR BODY

[75] Inventor: Bernard Joseph Coughlin, Crawley, England

[73] Assignee: U.S. Philips Corporation, New York, N.Y.

[22] Filed: Jan. 10, 1972

[21] Appl. No.: 216,430

[30] Foreign Application Priority Data

Jan. 11, 1971 Great Britain .................... 1,193/71

[52] U.S. Cl. ................. 148/189, 148/186, 148/187, 148/188, 252/62.3 E

[51] Int. Cl. ............................................ H01l 7/44

[58] Field of Search .................... 148/189, 186, 174, 148/187, 188, 190, 105, 106; 252/62.3 E

[56] References Cited

UNITED STATES PATENTS

| | | | |
|---|---|---|---|
| 3,660,178 | 5/1972 | Takahashi et al. | 148/187 X |
| 3,215,571 | 11/1965 | Frieser | 148/189 |
| 3,615,944 | 10/1971 | Sheng et al. | 148/189 |
| 3,164,501 | 1/1965 | Beale et al. | 148/189 |
| 3,649,388 | 3/1972 | Joshi et al. | 148/189 |

*Primary Examiner*—G. F. Ozaki
*Attorney*—Frank R. Trifari

[57] ABSTRACT

Method of diffusing vapor impurity into semiconductor body comprising providing impurity source and semiconductor body in separate open-ended vessels, inserting vessels in furnace and heating semiconductor body to diffusion temperature range before initiating diffusion on significant scale, and diffusing impurity into semiconductor body. Also, product made by method.

9 Claims, 3 Drawing Figures

Patented Aug. 28, 1973 3,755,017

METHOD OF DIFFUSING AN IMPURITY INTO A SEMICONDUCTOR BODY

Figure 1:
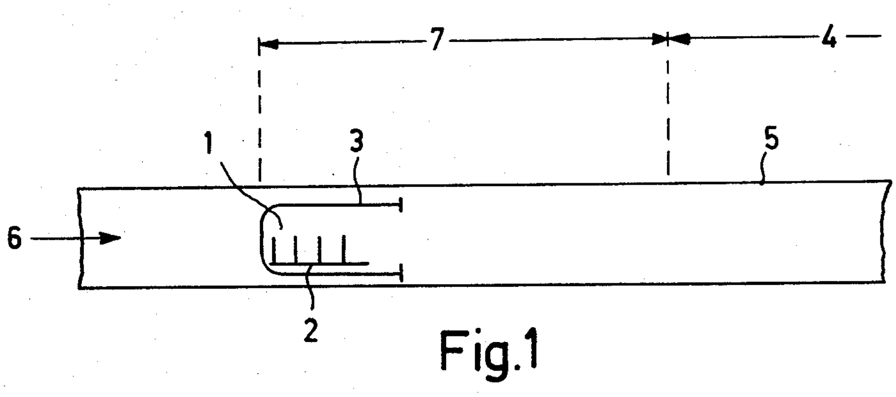

This invention relates to a method of diffusing an impurity into a semiconductor body.

Various methods are employed for diffusion of an impurity into a semiconductor body. In one commonly employed method, known as the open tube method, a plurality of semiconductor wafers are inserted on a boat into a furnace tube, and a gas stream containing impurity vapour in elemental or compound form is caused to pass over the heated semiconductor wafers. Various techniques are used in this method to introduce the impurity vapour into the gas stream, for example, prior to being passed over the semiconductor body, the gas stream may be passed over a heated impurity containing source, the impurity being in either elemental or compound form.

When using such a known method of diffusion various problems may arise. The gas flow pattern in the furnace tube may give rise to considerable variations in the values of the sheet resistance of simultaneously diffused regions, both between corresponding regions in a single wafer and between corresponding regions in different wafers. A further disadvantage of such a known method is that impurity from the gas stream is deposited over the internal wall surface of the tube as well as on the wafers themselves.

In another known method, both the wafers on a boat and a solid impurity source are heated in a closed vessel to effect diffusion of the impurity. Such a method is known as the "closed box" method. When using the "closed box" method, during the initial heating of the wafers and boat, a temperature gradient exists across the wafer due to the thermal capacity of the boat. Since the impurity source is present in the closed vessel during this heating period, that is before the boat and slices have reached the required diffusion temperature, considerable variations across the slice may occur in the depth of the diffusion and in electrical parameters such as sheet resistance of diffused regions. Such undesirable variations occur especially when the diffusion time is short, as is usually the case when shallow diffusions are required.

According to the invention there is provided a method of diffusing an impurity from the vapour phase into a semiconductor body, wherein the semiconductor body and an impurity source are placed in separate open-ended vessels, which are separately introduced into a diffusion furnace and connected at their open ends to form a closed container. After its introduction in the furnance but prior to the connection, the vessel containing the semiconductor body is heated in the furnace at a temperature in the region of the diffusion temperature that is to be subsequently employed, such heating being carried out for a sufficient period to establish a uniform temperature throughout the semiconductor body, and the impurity diffusion is effected in the closed container formed after the connection.

Very shallow yet consistent diffusions may be possible using this method. Sheet resistance measurements across slices and between slices of diffused regions obtained by this method have shown that it is possible to achieve as low a variation as 20 percent and in many instances not more than 5 percent. No lower time limit for the diffusion is set by the heating period required for the boat and semiconductor wafers as in the "closed box" method. The method still retains however, two of the advantages of the "closed box" method: the diffusion proceeds under substantially constant vapour pressure, avoiding the irregularities in impurity deposition caused by the presence of a carrier gas flow, and contamination of the furnace tube is substantially avoided. One economic advantage over the "closed box" method, in which the closed vessel must be broken to remove the slices after diffusion, is that the two vessels used in the present method may be reused a number of times, the limit being set by contamination by the diffusion impurity of the quartz walls generally employed for the vessels.

A method in accordance with the invention combines the advantages of both an open-tube method and a closed box mehtod, without the attendant disadvantages.

The vessel containing the impurity source may be introduced into the furnace and heated to a temperature in the region of the diffusion temperature prior to the connection to the vessel containing the semiconductor body.

The prior heating of the vessel containing the source ensures that the diffusion of impurity proceeds under conditions of thermal equilibrium. A further advantage is that an undesirable contaminants which may initially be emitted by the source at temperatures lower than the diffusion temperature do not reach the semiconductor body.

The first and second vessels may each be of tubular construction, each being closed at one end, the other end being open and flat, and the connection being by abutment of the flat ends. The connection of the open ends of the first and second vessels to form a closed vessel is to be understood in the context to mean that a perfect seal need not be formed at the connection.

A gas flow may be maintained in the furnace and prior to introduction into and heating in a high temperature zone of the furnace, at least one of the open-ended vessels may be introduced into a low temperature zone of the furnace where it is flushed for a period by the gas flow.

The furnace may comprise a tube, the open-ended vessels being introduced at one end of the tube. The vessels may be introduced into the furnace in opposition to the gas flow and transferred from the low temperature zone to the high temperature zone also in opposition to the gas flow.

Figure 2:
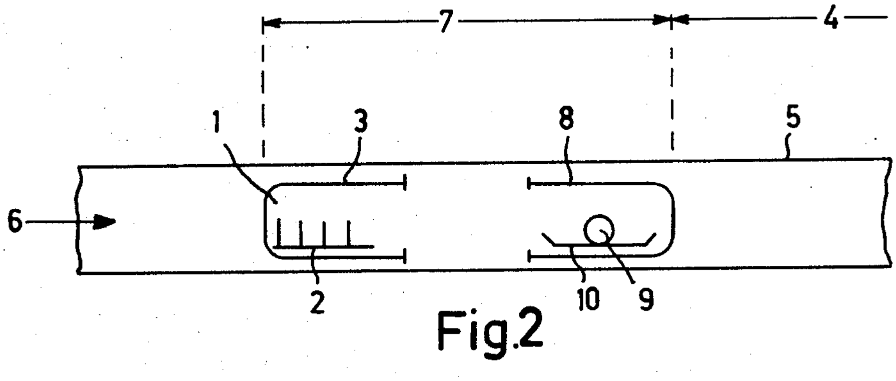
Figure 3:
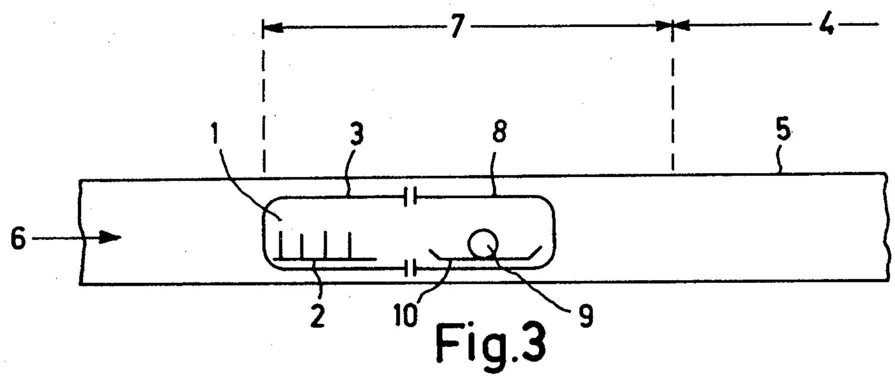

Embodiments of the invention will now be described, by way of example, with reference to the accompanying diagrammatic drawing in which:

FIG. 1 is a sectional view of the diffusion and furnace with a vessel therein containing semiconductor wafers, during the heating of the semiconductor wafers, FIG. 2 is a sectional view of the diffusion furnace, with a further vessel therein containing an impuirty source prior to diffusion of the impurity into the semiconductor wafers, FIG. 3 is a sectional view of the diffusion furnace and the vessels during the diffusion.

Referring to FIG. 1, semiconductor wafers 1 on a boat 2 are loaded into a first vessel 3. The wafers 1 are, e.g., 38 mm in diameter and 200 $\mu$thick and up to 50 wafers may be treated together. The vessel 3 which is of quartz and tubular in shape with one end closed, is, e.g., 15 cms long and 5 cms in internal diameter. The vessel 3 is introduced closed end first into a cold zone 4 of a diffusion furnace 5 and flushed for, e.g., 10 minutes in a nitrogen gass flow, having a flow rate of approximately ½litre/min in the direction indicated by arrow 6, to remove atmospheric gasses. The tube of the diffusion furnace 5 has an internal bore of, e.g., 6 cms. The vessel 3 is then transferred to a hot zone 7 where it remains for 15 minutes, for example, until the vessel and contents attain the diffusion temperature, and at the same time a second vessel 8 similar to the first vessel 3, but containing a solid impurity source 9 on a boat 10 is introduced, open end first, into the cold zone 4 (see FIG. 2) and flushed with a nitrogen flow for 10 minutes. After flushing, the vessel 8 is transferred to the hot zone 7 where it is heated whilst being separated from the first vessel 3 by a distance of, for example, 15 cms. In this particular embodiment the time taken for each of the two vessels to reach the diffusion temperature is 15 minutes; the time required is, however, dependent on the thermal capacity of the vessels used.

When both vessels 3, 8 have reached the diffusion temperature, the open ends of the vessel, which have previously been ground together, are abutted to form a substantially closed container. The diffusion of impurity into the semiconductor wafers 1 from the source 9 then occurs.

After a given time, dependent inter alia on the surface concentration and depth of diffusion required, the vessel 8 containing the source is removed from the furnace. The vessel 3 containing the wafers 1 may be subjected to a controlled time-dependent temperature variation before removal from the furnace 5, to enhance electrical characteristics associated with the diffused regions of the wafers.

Examples of diffusions carried out using the embodiment of a method in accordance with the invention as described above are as follows:

EXAMPLE 1

During the manufacture of *n–p–n* bipolar transistors, the slices 1 may comprise an *n*-type silicon epitaxial layer deposited on an $n^+$—type high conductivity silicon substrate of 200 microns thickness. The epitaxial layer has a resistivity of 0.5 ohm cm, and is 5 $\mu$thick, portions of this layer ultimately forming part of the collector regions of the transistors.

To form base regions for the transistors, the slices 1 are suitably masked using a surface oxide layer and boron diffused via openings in the oxide layer into exposed surface parts of the epitaxial layer. A suitable source is boron nitride and about 30 grams of boron nitride may be used in the vessel 8. The diffusion temperature is 1,000° C and the diffusion time, i.e. the time during which the two vessels 3, 8 remain abutted, is 30 minutes. The *p*-type base regions produced have a sheet resistance of 80 ohms per square and a surface impurity concentration of $10^{19}$ atoms/cc.

EXAMPLE 2

In an analogous manner, during the manufacture of *p-n-p* silicon transistors, *n*-type base regions are formed by diffusion of phosphorus into a *p*-type epitaxial layer having a resistivity of ½ohm cm. The diffusion temperature is 800° C and the diffusion time 15 minutes. The *n*-type base region produced has a resistivity of 200 ohms per square. The source used is phosphorus nitride (predominantly $P_3N_5$) in powder form.

Many variations are possible within the scope of the invention as defined in the appendant Claims. In particular, consistent boron diffusions to produce *p*-type regions having a sheet resistance as high as 1000 ohms per square are possible. Such regions may form resistors in integrated circuits formed in semiconductor bodies.

Many different sources may be used depending on the type of diffusion required. These sources must however be physically separate from the slices.

Since, however, it is very desirable that the source should be maintained at the same temperature as the semiconductor body during the diffusion, the source should be one which can be employed at the high temperatures necessary for the diffusion.

What is claimed is:

1. A method of diffusing a vapor phase impurity into a semi-conductor body, comprising the steps of:
   (a) providing said semiconductor body and a source of said impurity respectively in first and second vessels individually having at least one open end;
   (b) introducing said vessels into a diffusion furnace such that said open ends face each other and said vessels are spaced apart;
   (c) initially heating at least said first vessel containing said semiconductor body to the diffusion temperature range while said vessels are separated under conditions such that said semiconductor body is maintained substantially free of said vapor phase impurity, said initial heating being carried out until a substantially uniform temperature is established through said semiconductor body; thereafter
   (d) connecting said vessels to each other at their respective open ends so as to form a substantially closed container; and thereafter
   (e) heating said semiconductor body and said impurity source in said diffusion temperature range so as to vaporize said impurity source and diffuse said vapor phase impurity into said semiconductor body.

2. A method as recited in claim 1, wherein said second vessel containing said impurity source is introduced into said furnace and heated to said diffusion temperature range prior to the step of connecting said vessels.

3. A method as recited in claim 1, wherein said first and second vessels are each of tubular configuration and have only one open end, the other end of each said vessel being closed, said open ends being substantially flat and said vessels being connected at their respective open ends.

4. A method as recited in claim 1, wherein said furnace comprises high and low temperature zones, said high temperature zone being maintained at a temperature level adapted to heat said semiconductor body to a temperature within said diffusion temperature range, said method further comprising the step of positioning at least one of said vessels at said low temperature zone prior to the introduction of said one vessel into said high temperature zone and maintaining a gas flow through said furnace within said low temperature zone so as to flush said one vessel.

5. A method as recited in claim 4, wherein said vessels respectively containing said semiconductor body and said impurity source are introduced into said furnace in a direction opposite that of said gas flow and positioned in said low temperature zone, said vessels being transferred from said low temperature zone to said high temperature zone in said direction opposite to said gas flow direction.

6. A method as recited in claim 1, wherein said furnace comprises a tub having at least one open end and said vessels are introduced into said furnace at said open end.

7. A method as recited in claim 1, wherein said semiconductor body is of silicon.

8. A method as recited in claim 1, wherein said impurity source is one of boron nitride and phosphorous nitride.

9. A method as recited in claim 1, wherein said second vessel containing said impurity source is heated to said diffusion temperature range prior to the step of connecting said vessels.

* * * * *